United States Patent
Wu et al.

(10) Patent No.: US 8,785,115 B2
(45) Date of Patent: Jul. 22, 2014

(54) PHOTORESIST REMOVAL METHOD AND PATTERNING PROCESS UTILIZING THE SAME

(75) Inventors: Hung-Yi Wu, Keelung (TW); Yuan-Chi Pai, Tainan (TW); Yu-Wei Cheng, Kaohsiung (TW); Chang-Mao Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 295 days.

(21) Appl. No.: 13/370,226

(22) Filed: Feb. 9, 2012

(65) Prior Publication Data
US 2013/0210237 A1    Aug. 15, 2013

(51) Int. Cl.
*G03F 7/42*    (2006.01)

(52) U.S. Cl.
USPC .......................................... 430/329; 430/328

(58) Field of Classification Search
CPC ............................. G03F 7/42; H01L 21/31133
USPC .......................................... 430/322, 329, 331
See application file for complete search history.

(56) References Cited

U.S. PATENT DOCUMENTS

| | | |
|---|---|---|
| 7,247,887 B2 | 7/2007 | King et al. |
| 2006/0286804 A1* | 12/2006 | Wu et al. .................. 438/689 |
| 2007/0020565 A1 | 1/2007 | Koh et al. |
| 2007/0158756 A1 | 7/2007 | Dreeskornfeld et al. |
| 2008/0220375 A1* | 9/2008 | Kim et al. ................. 430/315 |
| 2008/0248429 A1 | 10/2008 | Chou et al. |
| 2009/0233238 A1 | 9/2009 | Hsu et al. |
| 2009/0258500 A1 | 10/2009 | Yang et al. |
| 2010/0233622 A1 | 9/2010 | Lee et al. |

* cited by examiner

*Primary Examiner* — Kathleen Duda
(74) *Attorney, Agent, or Firm* — J.C. Patents

(57) ABSTRACT

A photoresist removal method is described. A substrate having thereon a positive photoresist layer to be removed is provided. The positive photoresist layer is UV-exposed without using a photomask. A development liquid is used to remove the UV-exposed positive photoresist layer. The substrate as provided may further have thereon a sacrificial masking layer under the positive photoresist layer. The sacrificial masking layer is removed after the UV-exposed positive photoresist layer is removed.

16 Claims, 2 Drawing Sheets

PHOTORESIST REMOVAL METHOD AND PATTERNING PROCESS UTILIZING THE SAME

BACKGROUND OF THE INVENTION

1. Field of Invention

This invention relates to an integrated circuit (IC) process, and more particularly relates to a photoresist removal method, and a patterning process utilizing the photoresist removal method.

2. Description of Related Art

In IC manufacturing, a patterned photoresist layer is traditionally removed using oxygen plasma after the patterns thereof are transferred to the target layer. However, oxygen plasma causes oxidation and bombardment damage to the underlying film stack.

In order to avoid oxidation and bombardment damage, a solvent such as OK73™ or LA95™ can be used to strip the patterned photoresist layer. However, such wet clean process has a lower photoresist cleaning effect because the solvent is difficult to remove the hybrid layer between the photoresist and the bottom anti-reflective coating (BARC). The solvent for removing the BARC is also difficult to remove the hybrid layer, so that the BARC under the hybrid layer either cannot be completely removed.

SUMMARY OF THE INVENTION

Accordingly, this invention provides a photoresist removal method without the problems of the oxygen plasma treatment and/or solvent stripping.

This invention also provides a patterning process that utilizes the photoresist removal method of this invention.

The photoresist removal method of this invention is described as follows. A substrate having thereon a positive photoresist layer to be removed is provided. The positive photoresist layer is UV-exposed without using a photomask. A development liquid is used to remove the UV-exposed positive photoresist layer.

The patterning process of this invention is described as follows. A substrate having thereon a material layer to be patterned is provided. A patterned positive photoresist layer is formed over the material layer. The material layer not under the patterned positive photoresist layer is removed. The above photoresist removal method of this invention is performed to remove the patterned positive photoresist layer.

In an embodiment, a sacrificial masking layer is formed over the material layer before the patterned positive photoresist layer is formed, and is patterned using the patterned positive photoresist layer as a mask after the patterned positive photoresist layer is formed but before the material layer not under the patterned positive photoresist layer is removed. The sacrificial masking layer is removed, possibly using a solvent, after the UV-exposed patterned positive photoresist layer is removed.

Since exposure and development are utilized instead of $O_2$ plasma or a stripping solvent in the photoresist removal method of this invention, the under layer does not suffer from oxidation or damage, and the photoresist removal efficiency is not lower.

In order to make the aforementioned and other objects, features and advantages of the present invention comprehensible, a preferred embodiment accompanied with figures is described in detail below.

DESCRIPTION OF EMBODIMENTS

It is noted that the following embodiment is intended to further explain this invention but not to limit its scope. Specifically, although the photoresist removal method is applied to a patterning process in a high-K and metal-gate CMOS process in the following embodiment, it can be applied to any other patterning process as long as the under layers sustain UV-exposure and the development liquid.

Figure 2:
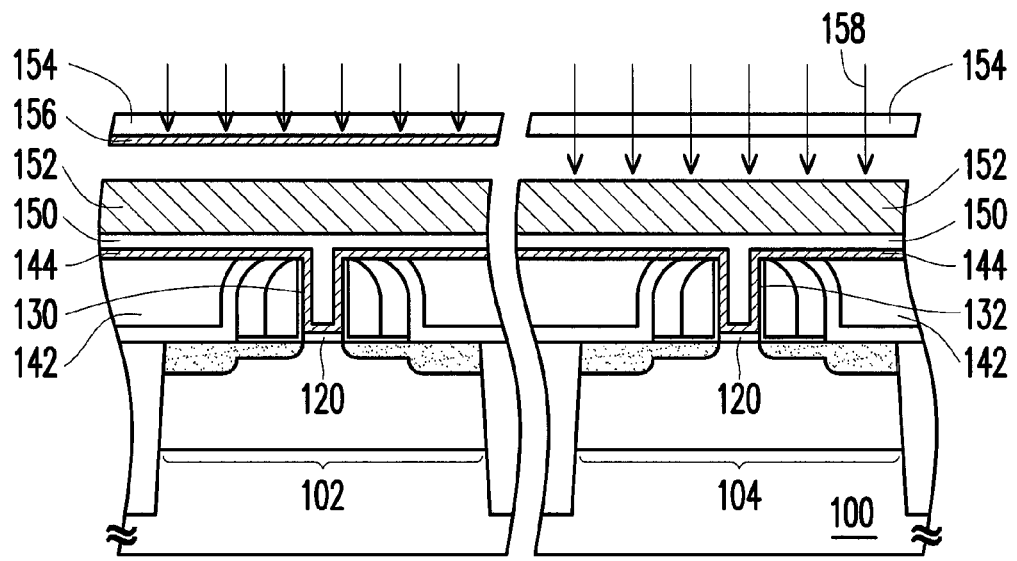
Figure 3:
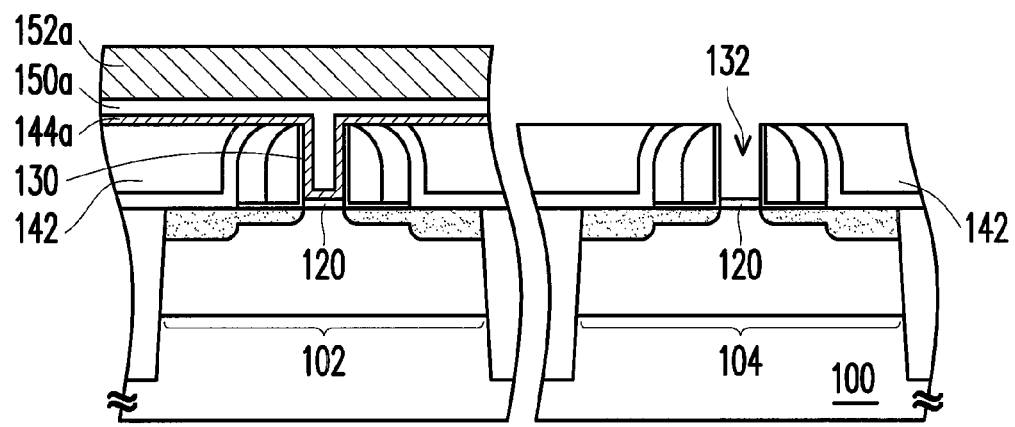
Figure 4:
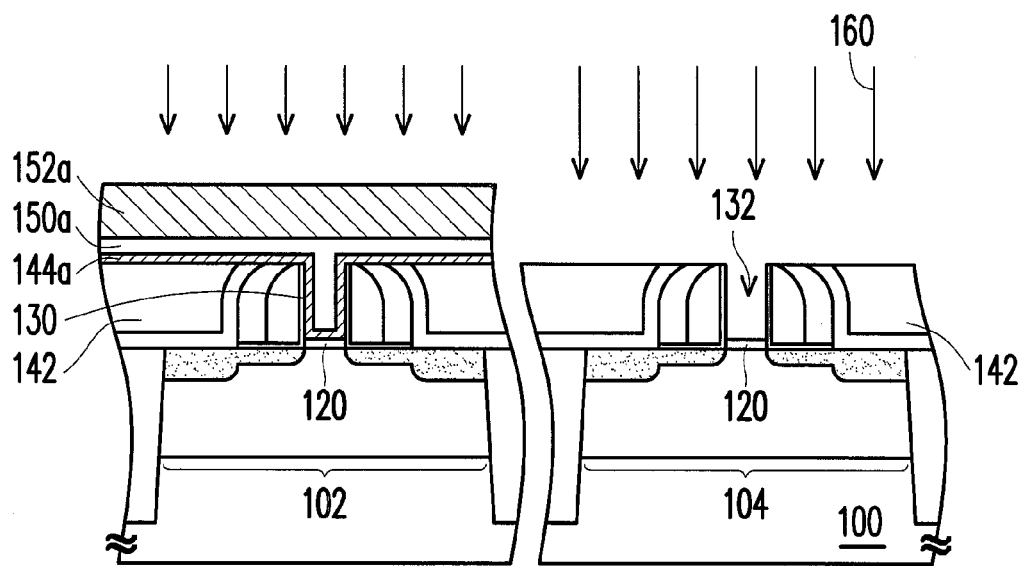
Figure 5:
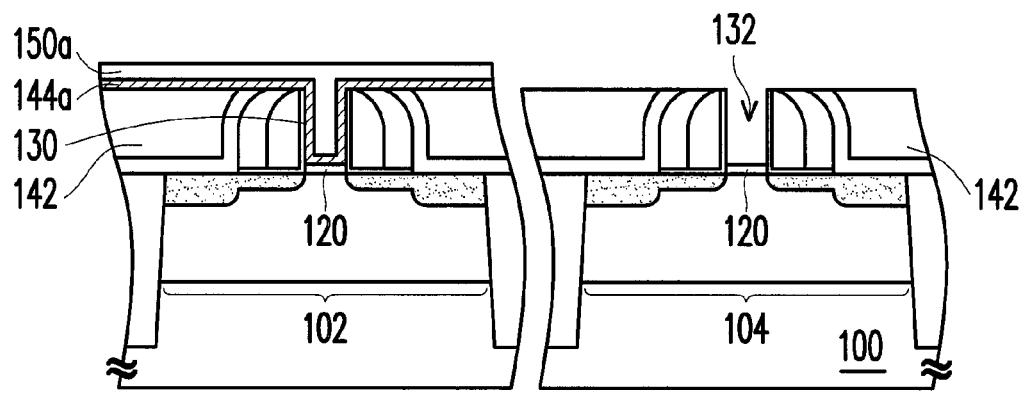
Figure 6:
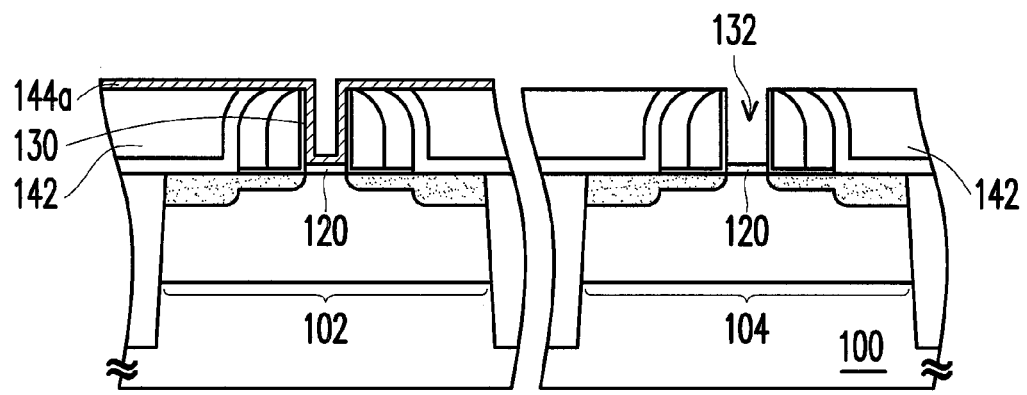

FIGS. 1-6 illustrate, in a cross-sectional view, a patterning process according to an embodiment of this invention, wherein FIGS. 4-6 also illustrate a photoresist removal method according to the embodiment.

Figure 1:
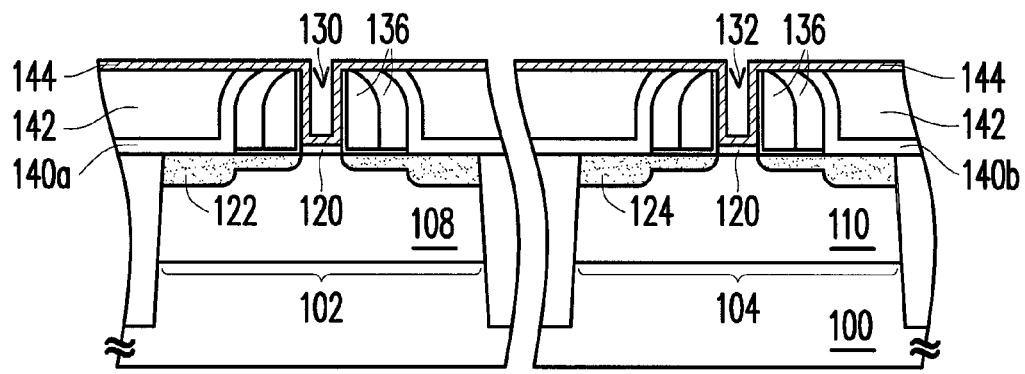
FIGS. 1-6 illustrate, in a cross-sectional view, a patterning process according to an embodiment of this invention, wherein FIGS. 4-6 also illustrate a photoresist removal method according to the embodiment.

Referring to FIG. 1, a semiconductor substrate 100 to be formed with a CMOS device is provided, having thereon a NMOS area 102 and a PMOS area 104. A P-well 108 is formed in the substrate 100 in the NMOS area 102. An N-well 110 is formed in the substrate 100 in the PMOS area 104. A gate dielectric layer 120, which may be a single high-K layer or a film stack including a high-K layer, is formed on the substrate 100 in each of the NMOS area 102 and the PMOS area 104. When the gate dielectric layer 120 is a film stack including a high-K layer, other layers therein may include a dielectric liner under the high-K layer and a diffusion barrier layer on the high-K layer.

In addition, N-type source/drain (S/D) regions 122 of the NMOS are formed in the P-well 108, and P-type S/D regions 124 of the PMOS are formed in the N-well 110. A hole 130 for forming a metal gate of the NMOS is formed over the NMOS area 102, surrounded by a (double) spacer 136, a contact etching stop layer (CESL) 140a applying a tensile stress, and a dielectric layer 142. A hole 132 for forming a metal gate of the PMOS is formed over the PMOS area 104, surrounded by a (double) spacer 136, a CESL 140b applying a compressive stress, and the dielectric layer 142. Each of the holes 130 and 132 is formed by removing a dummy gate formed previously.

A work-function metal layer 144 suitable for the gate of N-type device is formed substantially conformally over the above structure, filling in the gate holes 130 and 132. Examples of the work-function metal material suitable for the gates of N-type devices include, but are not limited to, TiAl, ZrAl, WAl, TaAl and HfAl. However, one of ordinary skill in the art would easily realize that the material of the work function metal layer 144 is not limited to the abovementioned metals; it can be other material having a work function between about 3.9 eV and about 4.3 eV. Because the work-function metal layer 144 suitable for a NMOS gate is not suitable for a PMOS gate, the portion thereof on the PMOS area 104 has to be removed.

Referring to FIG. 2, a sacrificial masking layer 150 and a positive photoresist layer 152 are then formed over the substrate 100, wherein the sacrificial masking layer 150 fills in the holes 130 and 132 for forming metal gates. The sacrificial masking layer 150 is a layer having a superior gap-filling characteristic, such as a bottom anti-reflective coating (BARC) or a sacrificial light-absorbing material (SLAM) layer, but is not limited thereto. The BARC may include a light-absorbing oxide material (DUO), such as DUO248™ (made by Honeywell Electronic Materials, a silicon-rich BARC material containing an organosiloxane-based polymer), but is not limited thereto. A photomask 154 having thereon an opaque pattern 156 masking the NMOS area 102 is used to perform a UV-exposure step 158, so that the portion of the positive photoresist layer 152 on the PMOS area 104 is UV-exposed. The UV-exposure step 158 may have a dose of 30-40 mJ/cm$^2$.

Referring to FIG. 3, the UV-exposed portion of the positive photoresist layer 152 on the PMOS area 104 is removed using a development liquid. The development liquid contains an alkaline compound, such as tetramethylammonium hydroxide (TMAH). The portions of the sacrificial masking layer 150 and the work-function metal layer 144 exposed thereby are removed using the patterned positive photoresist layer 152a as a mask, exposing the gate dielectric layer 120 in the hole 132 on the PMOS area 104. The remaining sacrificial masking layer 150a and the remaining work-function metal layer 144a are located on the NMOS area 102 only.

Referring to FIG. 4, another UV-exposure step 160 is performed to the entire substrate 100 without using a photomask, so that the patterned positive photoresist layer 152a is UV-exposed. The UV-exposure 160 may have a dose of 45-50 mJ/cm$^2$.

Referring to FIG. 5, the patterned positive photoresist layer 152a having been UV-exposed is then removed using a development liquid, which usually has the same composition of the development liquid used to pattern the positive photoresist layer 152 (FIG. 3) in the previous patterning procedure of the work-function metal layer 144.

Referring to FIG. 6, a solvent is used to remove the patterned sacrificial masking layer 150a. For example, when the sacrificial masking layer 150a includes DUO248™, the solvent can be CLK-888™ that mainly includes 2,3,4,5-tetrahydrothiophene-1,1-dioxide ($C_4H_8O_2S$, sulfolane), tertamethylammonium hydroxide [$(CH_3)_4NOH$, TMAH] and $H_2O$.

After the above patterning process of this embodiment, it is possible to deposit over the substrate 100 another work-function metal layer suitable for the PMOS gate, deposit a low-resistance metal layer filling up the holes 130 and 132, and then remove the metal layers outside of the holes 130 and 132 to form metal gates of the NMOS and PMOS transistors (not shown).

Besides, though the work-function metal layer for the NMOS gate is patterned to expose the gate dielectric layer of the PMOS in the above embodiment, the photoresist removal method of this invention can also be applied to a case where the work-function metal layer for a PMOS gate is patterned to expose the gate dielectric layer of NMOS.

Since exposure and development are utilized instead of $O_2$ plasma or a stripping solvent in the photoresist removal method of this invention, the under layer does not suffer from oxidation or damage, and the photoresist removal efficiency is not lowered.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A photoresist removal method, comprising:
providing a substrate having thereon a patterned positive photoresist layer to be removed and a patterned sacrificial masking layer between the patterned positive photoresist layer and the substrate;
UV-exposing the patterned positive photoresist layer without using a photomask;
using a development liquid to remove the UV-exposed patterned positive photoresist layer; and
removing the patterned sacrificial masking layer.

2. The photoresist removal method of claim 1, wherein the positive photoresist layer on the substrate provided is a patterned positive photoresist layer.

3. The photoresist removal method of claim 2, wherein the patterned positive photoresist layer exposes a part of a MOS transistor.

4. The photoresist removal method of claim 3, wherein the exposed part of the MOS transistor includes a gate dielectric layer of the MOS transistor.

5. The photoresist removal method of claim 4, wherein the gate dielectric layer of the MOS transistor comprises a high-K layer.

6. The photoresist removal method of claim 1, wherein the patterned sacrificial masking layer comprises a patterned bottom anti-reflective coating (BARC).

7. The photoresist removal method of claim 6, wherein the patterned BARC comprises a patterned light-absorbing oxide material (DUO).

8. The photoresist removal method of claim 6, wherein removing the patterned sacrificial masking layer comprises using a solvent.

9. A patterning process, comprising:
providing a substrate having thereon a material layer to be patterned;
forming a sacrificial masking layer over the material layer;
forming a patterned positive photoresist layer over the sacrificial masking layer;
patterning the sacrificial masking layer using the patterned positive photoresist layer as a mask;
removing the material layer not under the patterned positive photoresist layer;
UV-exposing the patterned positive photoresist layer without using a photomask; and
using a development liquid to remove the UV-exposed patterned positive photoresist layer; and
removing the patterned sacrificial masking layer.

10. The patterning process of claim 9, wherein the sacrificial masking layer comprises a bottom anti-reflective coating (BARC).

11. The patterning process of claim 10, wherein the BARC comprises a light-absorbing oxide material (DUO).

12. The patterning process of claim 10, wherein removing the patterned sacrificial masking layer comprises using a solvent.

13. The patterning process of claim 9, wherein a part of a first MOS transistor is exposed after the material layer not under the patterned positive photoresist layer is removed.

14. The patterning process of claim 13, wherein
the material layer comprising a gate material of a second MOS transistor, and
the exposed part of the first MOS transistor comprises a gate dielectric layer of the first MOS transistor.

15. The patterning process of claim 14, wherein the gate material comprises a work-function metal, and the gate dielectric layer comprises a high-K layer.

16. The patterning process of claim 14, wherein one of the first and the second MOS transistors is a NMOS transistor and the other is a PMOS transistor.

* * * * *